United States Patent [19]

Zion

[11] Patent Number: 5,027,311

[45] Date of Patent: Jun. 25, 1991

[54] CARRY SELECT MULTIPLEXER

[75] Inventor: Diane E. Zion, Santa Clara, Calif.

[73] Assignee: Intel Corporation, Santa Clara, Calif.

[21] Appl. No.: 429,562

[22] Filed: Oct. 31, 1989

[51] Int. Cl.$^5$ ............................................. G06F 7/50
[52] U.S. Cl. ............................................. 364/788
[58] Field of Search ............................... 364/788

[56] References Cited

U.S. PATENT DOCUMENTS

| | | | |
|---|---|---|---|
| 3,100,835 | 8/1963 | Bedrij | 364/788 |
| 3,553,446 | 1/1971 | Kruy | 364/788 |
| 3,743,824 | 7/1973 | Smith | 364/788 |
| 4,675,838 | 6/1987 | Mazin et al. | 364/788 |

Primary Examiner—David H. Malzahn
Attorney, Agent, or Firm—Blakely, Sokoloff, Taylor & Zafman

[57] ABSTRACT

A carry select multiplexer comprised of two parallel drivers for use in a complementary metal-oxide semiconductor (CMOS) circuit. The carry select multiplexer is used with a carry select adder in selecting the appropriate carryout from a given adder stage. Because an inverter is not used, only one gate delay is encountered in the signal path for generating the carryout.

3 Claims, 4 Drawing Sheets

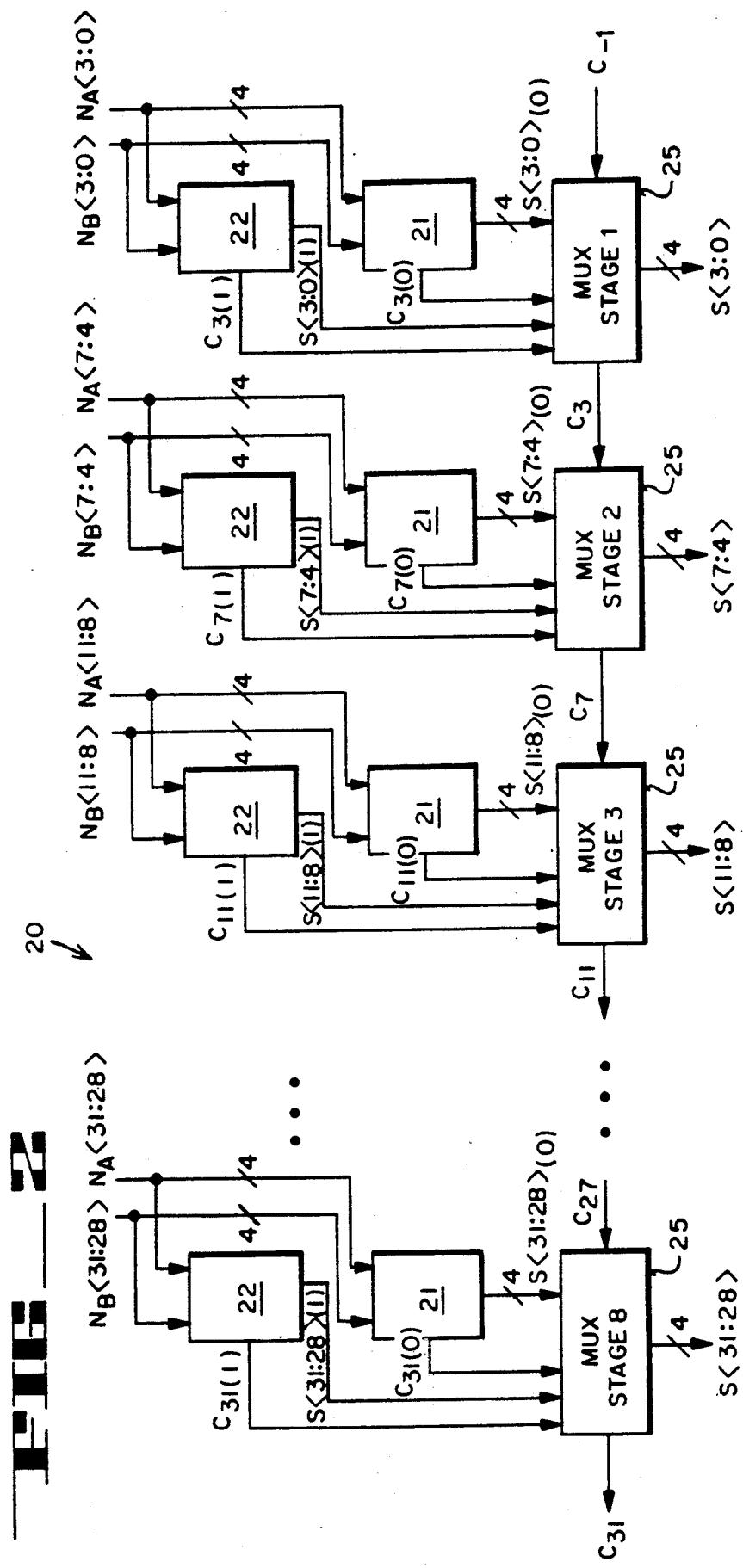
FIG_2

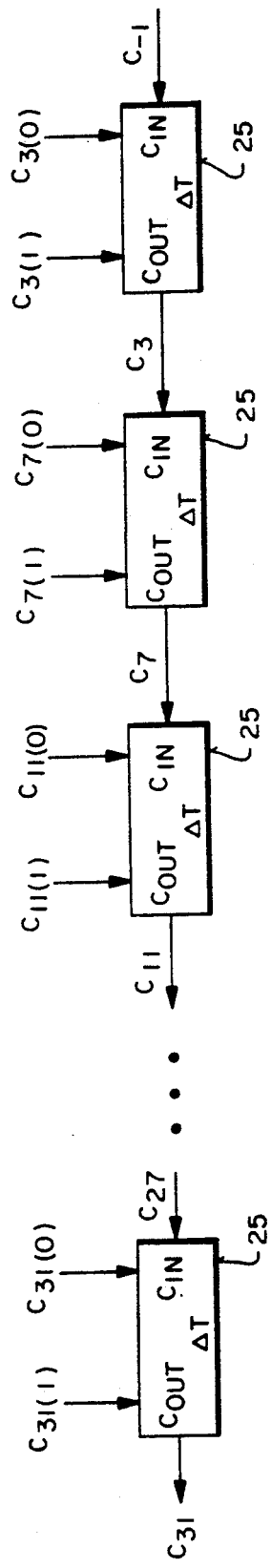
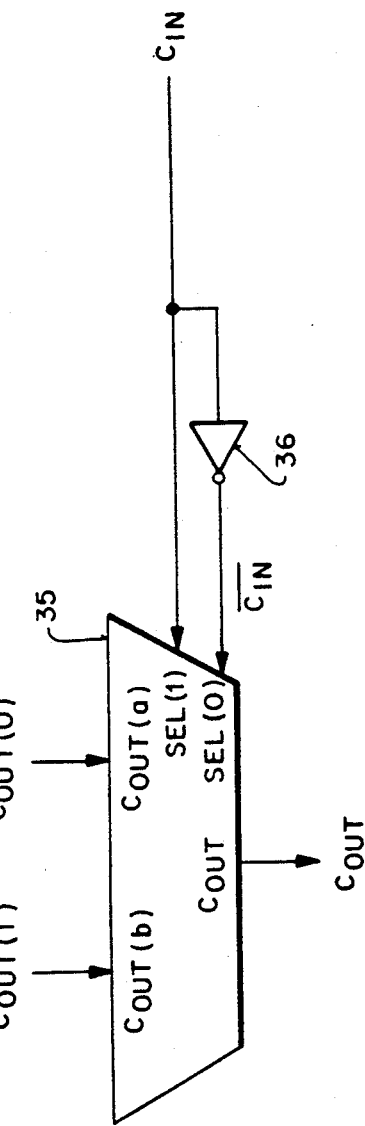
$\Delta T$ = DELAY FROM ACTUAL $C_{IN}$ TO $C_{OUT}$ PER STAGE
TOTAL DELAY FROM $C_{-1}$ TO $C_{31}$ = $8\Delta T$
FIG__3
FIG__4 (PRIOR ART)

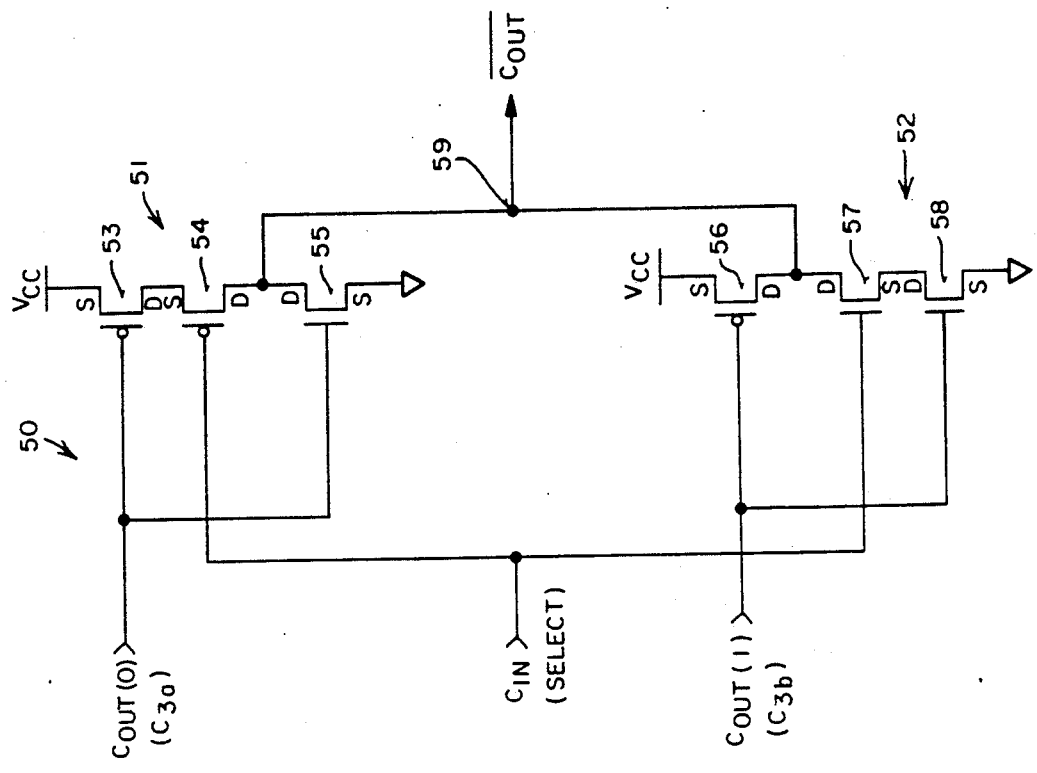
FIG_6
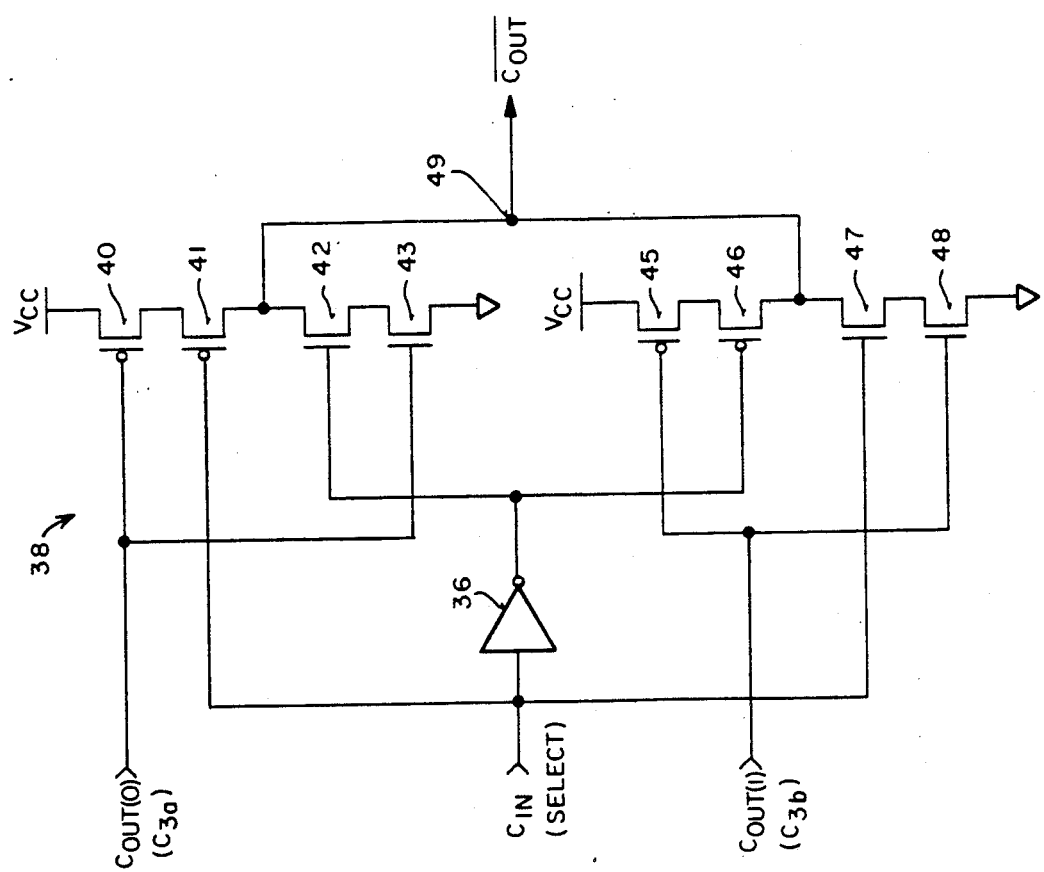
FIG_5 (PRIOR ART)

CARRY SELECT MULTIPLEXER

BACKGROUND OF THE INVENTION

1. Field of the Invention

The present invention relates to digital computation circuits and, more particularly, to a carry select multiplexer for use with a high speed adder.

2. Prior Art

The heart of any computer or microprocessor is the processor itself. One primary function of any processor is its ability to perform arithmetical or logical operations on various inputs to the processor. Various schemes are known in the prior art to provide such arithmetic and logic operations. One necessary arithmetic function inherent in most processors is the ability to add two digital numbers. Throughout the development of processors, the emphasis has constantly been placed on increasing the speed of operation of the processor and components within such processors.

Because many mathematical operations performed by a processor involve iterative computations, the more recent processors implement a number of simultaneous parallel operations in order to decrease the actual iterative cycle. For example, in one prior art scheme, in carrying out an addition operation of two binary numbers, a carryin to a given stage is needed prior to calculating and deriving the sum and carryout from that stage. In a different scheme, the more recent processors utilize the parallel operation technique wherein two adders are provided for each stage. One adder assumes a carryin value of zero while the second adder assumes a carryin value of one. The summation operation is performed and the results from the two adders are determined, wherein the carry input from the previous stage is used to select the proper adder output from that stage. One such selection means is known as a carry select multiplexer, wherein the carryin to a given stage determines which adder output is selected as the output from that stage.

It is to be appreciated that any time savings which can be obtained in any of the operations performed by an adder, will ultimately result in a decrease in the overall computation time for a given processor. Accordingly, any decrease in the time required to select a carry to the next stage will also result in the reduction of time in performing computations within the processor. Consequently, it will be appreciated to those skilled in the art that the reduction of the delay inherent in any stage of the carry select circuitry will improve the speed of operation of a processor. Additionally, improving the speed of an adder is especially important when the adder is on the same integrated circuit chip as other circuits, such as in a microprocessor chip which includes other processing functions, because the time needed to perform the addition provides the dominant delay, rather than the inter-chip communication time. Therefore, any reduction in the computation time or the output selection time will improve the overall speed of the processor.

SUMMARY OF THE INVENTION

The present invention describes a carry select multiplexer for use in a CMOS implementation where only a single gate delay is encountered. In a typical carry select adder, two individual adders are used to add corresponding bits of two numbers. One adder assumes a carryin of zero and the second adder assumes a carryin value of one. Two sets of carryouts and sums are generated by the adders and are coupled as inputs to a carry select multiplexer. The carry select multiplexer receives a carryin signal and utilizes the carryin signal to select the appropriate carryout and the sum. Where prior art carry select multiplexer circuits require two gate delays, the present invention utilizes a unique boolean relationship to derive a circuit having only one gate delay.

BRIEF DESCRIPTION OF THE DRAWINGS

FIG. 2 is a block diagram illustrating a carry select adder implementing a dual adder scheme.

FIG. 3 is a block diagram illustrating the delay encountered in the ripple effect of the carry select multiplexer.

FIG. 4 is a prior art CMOS carry select multiplexer.

FIG. 5 is a circuit diagram of a prior art carry select multiplexer.

FIG. 6 is a circuit schematic diagram of a carry select multiplexer of the present invention.

DETAILED DESCRIPTION OF THE PRESENT INVENTION

Figure 1:
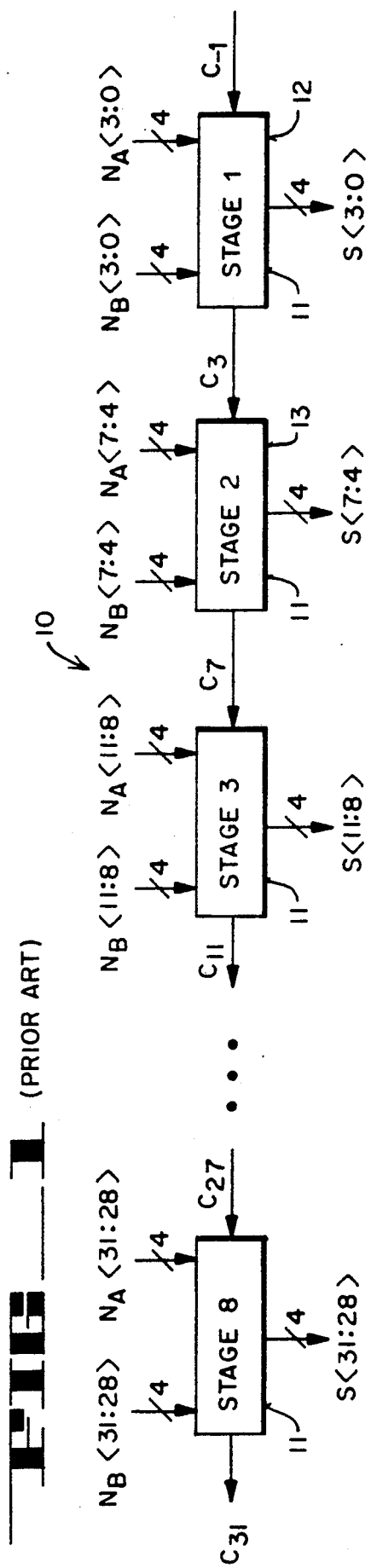
FIG. 1 is a block diagram illustrating a prior art ripple carry adder.

A carry select multiplexer for selecting a proper carry output from a carry select adder to improve the speed of the adder is described. In the following description numerous specific details are set forth, such as specific circuit interconnections, etc., in order to provide a thorough understanding of the present invention. It will be obvious, however, to one skilled in the art that the present invention may be practiced without these specific details. In other instances well-known structures and methods have not been described in detail in order not to unnecessarily obscure the present invention.

Referring to FIG. 1, a prior art ripple carry adder 10 is shown for adding two 32-bit numbers $N_A$ and $N_B$. Adder 10 is comprised of eight separate adder stages 11, wherein each stage 11 adds two 4-bit portions of $N_A$ and $N_B$. That is, each stage 11 is capable of adding two 4-bit numbers. For stage 11 to be a full adder, the two 4-bit numbers are added to a carryin, such that a sum and a carryout is generated. For example, for the very first stage 12, bits 0-3 of the two numbers $N_A$ and $N_B$ are added. A carryin from the previous stage, designated as $C_{-1}$ is also added to the two 4-bit numbers. Stage 12 then outputs a 4-bit sum (designated as $S<3:0>$). A carryout, designated as $C_3$ (designating a carry from bit 3) is coupled as a carryin to the second stage 13.

Therefore, in operation, the first stage 12 adds the two 4-bit numbers and the carryin to generate a sum and a carryout. The carryout is coupled as a carryin to the second stage 13, wherein the carry $C_3$ is added to the next 4-bits of the two numbers ($N_A<7:4>$ and $N_B<7:4>$) for generating bits $<7:4>$ of the sum, as well as generating the carry $C_7$ to the subsequent stage. This simplified adder 10 is known as a ripple carry adder since the carry from the previous stage must be rippled to the current stage before the computation in the current stage can occur. By utilizing the prior art adder 10 of FIG. 1, the computation is achieved in a serial fashion. Because of the ripple effect computation time is delayed.

Even with the utilization of look-ahead circuitry to predict the carryout from a stage 11 prior to the computation of the sum, the carryouts must still be rippled through the various stages. Various schemes have been devised to reduce the amount of time necessary for generating the final sum and the carry. One such scheme utilizing a partition regenerative carry look-ahead adder is described in U.S. Pat. No. 4,737,926.

However, in order to still improve the speed of the adder and decrease the delay time in generating the sum and a carry, a parallel adder scheme was developed. Referring to FIG. 2, a prior art dual adder scheme is shown in which two separate adders are utilized for each 4-bit stage of an adder 20. Instead of having a single adder for each 4-bit stage, such as that of adder 11 of FIG. 1, the dual adder scheme of adder 20 has two adders 21 and 22 for each 4-bit stage. Adders 21 and 22 are arranged in parallel and coupled to accept corresponding 4-bits of the two numbers $N_A$ and $N_B$. However, instead of having the carryin coupled to each of the dual adder stages 21 and 22, the carryin to each stage is coupled to a carry select multiplexer (MUX) 25.

In operation, adder 21 of each stage adds the corresponding 4-bits of the two numbers assuming a carryin value of zero. Adder 22 of each stage adds its corresponding 4-bits of the two numbers assuming a carryin value of one. The principle of the carry select adders 21 and 22 is to generate two sums and two carryouts, wherein one sum and carryout assumes a carryin of zero while the other sum and carryout assumes a carryin of one. The carryout and the sum from each of the adders 21 and 22 are coupled to a carry select MUX 25, wherein the carry select MUX 25 selects the proper carryout and the sum. The selection of the appropriate sum and carryout of each carry select MUX 25 is determined by the carryin to that MUX 25. Thus, $C_{-1}$ selects between the sum and carryout of adders 21 and 22 of the first stage. The carryout $C_3$ from MUX 25 of the first stage operates as the carryin to MUX 25 of the second stage, wherein $C_3$ selects between the sum and carry of adders 21 and 22 of the second stage.

By implementing the dual adder scheme 20 of FIG. 2, all of the stages operate in parallel in adding its corresponding 4-bits of the two numbers. As stated above, one adder 21 assumes a carryin value of zero while the second adder 22 of each stage assumes a carryin value of one. Thus, for each stage the sum and carry are calculated simultaneously and the only ripple effect occurs in the operation of the carry select MUXs 25. The overall speed of the adder is increased significantly over that of the ripple carry adder of FIG. 1 since the only ripple effect is in the transition of the carrys from one MUX stage 25 to the next MUX stage 25.

In order to show the delay caused by the ripple effect of the carry select MUXs 25, an equivalent circuit 30 for the plurality of carry select MUXs 25 of FIG. 2 is shown in FIG. 3. In FIG. 3, only the carrys are shown since the carrys determine the actual selection process in each MUX stage 25. Although the pair of sum inputs and the sum output of each stage 25 is not shown in FIG. 3, it is understood that each select MUX 25 (or an equivalent circuit) is also used to select the proper sum from each stage. Still utilizing a 32-bit adder as an example, each carry select MUX 25 will introduce a delay time, $\Delta T$ ($\Delta T$ representing a delay within each four-bit stage), wherein because of the serial nature of the ripple effect the total overall delay will be $8\Delta T$. Thus, the total delay introduced by the ripple effect of the carrys through the various carry select stages 25 is $8\Delta T$ for the example circuit 30 of FIG. 3. Therefore, it is appreciated that any reduction in the delay time $\Delta T$ for each stage will result in a reduction of the overall delay time by the same percentage. For example, if the delay $\Delta T$ for each stage 25 can be reduced by 50%, then the resultant delay of $\frac{1}{2} \Delta T$ for each stage will result in the total delay of $4\Delta T$ for the eight stage circuit 30 of FIG. 3.

Referring to FIG. 4, a typical prior art multiplexing scheme for each carry select MUX stage 25 is shown comprised of MUX 35 and an inverter 36. The two carry inputs, one based on a carryin of zero and the second based on a carryin of one are coupled as inputs to MUX 35 and are shown as $Cout_0$ and $Cout_1$, respectively. The carryin is coupled to the select input, $SEL_1$, as well as to a second select input, $SEL_0$, through an inverter 36. Therefore, when the carry input (Cin) has a value of 1, a high input appears at the input $SEL_1$ causing MUX 35 to select Cout(1). If the carryin Cin has a value of 0 then the high input is felt at $SEL_0$, wherein MUX 35 selects the carryout $Cout_0$ as the carryout Cout.

Referring to FIG. 5, a CMOS implementation of the traditional inverting multiplexer 25 is shown in a circuit schematic. The circuit of FIG. 5 is comprised of two sets of CMOS drivers and the inverter 36. The first CMOS driver is comprised of two p-type transistors 40 and 41 and two n-type transistors 42 and 43 coupled in series between a supply voltage, VCC, and its return, which in this instance is ground. Transistors 40 and 41 are coupled between VCC and an output node 49, while transistors 42 and 43 are coupled between the output node 49 and ground.

The second driver is comprised of two p-type transistors 45 and 46 and two n-type transistors 47 and 48 coupled in series between VCC and ground. Transistors 45 and 46 are coupled between VCC and the output node 49, while transistors 47 and 48 are coupled between the output node 49 and ground. The input $Cout_0$ is coupled to the gates of transistors 40 and 43, while $Cout_1$ is coupled to the gates of transistors 45 and 48. The carryin signal Cin is coupled to the gates of transistors 41 and 47, as well as to the input of inverter 36. The output of inverter 36 is coupled to gates of transistors 42 and 46. The output Cout is actually in a complement form Cout/ (/ is hereinafter used to denote a complement condition of a signal) at the output node 49.

It is to be noted that with the prior art multiplexer circuit of FIG. 5, two gate delays are evident in the signal path between the carryin Cin and the carryout Cout. That is, inverter 36 presents one gate delay and the other transistors 40–41, 42–43, 45–46, or 47–48 present the other gate delay, such that the two gate delays are cumulative and must be taken into account in determining the overall delay time of MUX circuit 38. The presence of the inverter 36 is necessitated by the fact that the circuit is a CMOS circuit and a complement of a signal Cin must be generated in order to obtain the full CMOS level output Cout. The two gate delays of circuit 38 combine to the delay $\Delta T$ of each stage 25. It is appreciated that a reduction in the total number of gate delays of each stage 25 will improve the overall delay time of each stage 25.

MULTIPLEXER CIRCUIT OF THE PRESENT INVENTION

The present invention provides for a novel multiplexer circuit which eliminates the requirement of the inverter 36 of FIG. 5 and, thereby, reduces one gate delay in each carry select MUX stage 25. However, in order to understand why inverter 36 may be eliminated, the following general concept must be understood. The reason for the elimination of inverter 36 may be demonstrated by the following boolean operations.

In general for an add, $$Si = Ai \oplus Bi \oplus Ci-1 \quad \text{(Equation 1)}$$

$$Ci = AiBi + Ci-1(Ai+Bi) \quad \text{(Equation 2)}$$

where Si is the sum bit, Ai and Bi are input bits for each of the two numbers A and B, Ci−1 is the carryin bit from the previous stage, and Ci is the carryout bit from the current stage.

But because, $$Ai + Bi = AiBi + Ai \oplus Bi \quad \text{(Equation 3)}$$

therefore, $$Ci = AiBi + Ci-1(AiBi) + Ci-1(Ai \oplus Bi) \quad \text{(Equation 4)}$$

$$Ci = AiBi(1+Ci-1) + Ci-1(Ai \oplus Bi) \quad \text{(Equation 5)}$$

$$Ci = AiBi + Ci-1(Ai \oplus Bi) \quad \text{(Equation 6)}$$

For simplicity, let $$Ti = Ai \oplus Bi \quad \text{(Equation 7)}$$

then the generate signal Gi for the stage equals, $$Gi = AiBi \quad \text{(Equation 8)}$$

and the propagate signal Pi for the stage equals, $$Pi = Ai + Bi = Gi + Ti \quad \text{(Equation 9)}$$

It is to be noted that the definitions of the variables Ti, Gi and Pi are established by equations 7, 8 and 9, and are defined to explain the workings of the present invention. Further, it is to be noted that the definition of Gi and Pi are arbitrarily set and do not necessarily correspond to generate and propagate signals used in other well-known circuits. Finally, $$Si = Ti \oplus Ci-1 \quad \text{(Equation 10)}$$

$$Ci = Gi + Ci-1 Ti \quad \text{(Equation 11)}$$

Using these equations, it can be shown that for bits 0 through 3 (<3:0>), which is the very first 4-bit stage, for a carryin value of zero the following equations apply:

$$\text{Carryin}(C-1) = 0$$

$$S0 = T0 \oplus C-1 = T0 \quad \text{(Equation 12)}$$

$$C0 = G0 + C-1 T0 = G0 \quad \text{(Equation 13)}$$

$$S1 = T1 \oplus C0 = T1 \oplus G0 \quad \text{(Equation 14)}$$

$$C1 = G1 + C0T1 = G1 + T1G0 \quad \text{(Equation 15)}$$

$$S2 = T2 \oplus C1 = T2 \oplus (G1 + T1G0) \quad \text{(Equation 16)}$$

$$C2 = G2 + C1T2 = G2 + T2G1 + T2T1G0 \quad \text{(Equation 17)}$$

$$S3 = T3 \oplus C2 = T3 \oplus (G2 + T2G1 + T2T1G0) \quad \text{(Equation 18)}$$

$$C3a(\text{carryout}) = G3 + C2T3 = G3 + T3G2 + T3T2G1 + T3T2T1G0 \quad \text{(Equation 19)}$$

And for a carryin value of one:

$$\text{Carryin}(C-1) = 1$$

$$S0 = T0 \oplus C-1 = T0 \quad \text{(Equation 20)}$$

$$C0 = G0 + C-1 T0 = G0 + T0 = P0 \quad \text{(Equation 21)}$$

$$S1 = T1 \oplus C0 = T1 \oplus P0 \quad \text{(Equation 22)}$$

$$C1 = G1 + C0T1 = G1 + T1P0 \quad \text{(Equation 23)}$$

$$S2 = T2 \oplus C1 + T2 \oplus (G1 + T1P0) \quad \text{(Equation 24)}$$

$$C2 = G2 + C1T2 = G2 + T2G1 + T2T1P0 \quad \text{(Equation 25)}$$

$$S3 = T3 \oplus C2 = T3 \oplus (G2 + T2G1 + T2T1P0) \quad \text{(Equation 26)}$$

$$C3b(\text{carryout}) = G3 + C2T3 = G3 + T3G2 + T3T2G1 + T3T2T1P0 \quad \text{(Equation 27)}$$

Looking at the terms C3a and C3b, it is logically possible for C3a and C3b to differ, only if P0≠G0, since:

$$C3a(\text{carryout}) = G3 + T3G2 + T3T2G1 + T3T2T1G0$$

$$C3b(\text{carryout}) = G3 + T3G2 + T3T2G1 + T3T2T1P0$$

If P0=G0, C3a=C3b because all other terms are identical.

Further examination shows that for $$G0 = A0B0$$

and $$P0 = A0 + B0$$

the following is true:

| A0 | B0 | G0 | P0 |
|----|----|----|----|
| 0  | 0  | 0  | 0  |
| 0  | 1  | 0  | 1  |
| 1  | 0  | 0  | 1  |
| 1  | 1  | 1  | 1  |

Thus, when P0=0, G0=0. Also, when G0=1, P0=1.

Reviewing the above truth table and the above equations, when both P0=0=G0, then C3a=C3b. In this case, no select signal is required for a carry select multiplexor. Similarly, when G0=1=P0, C3a=C3b, a multiplexor select signal is not required. A select signal is required only when C3a≠C3b in order to avoid signal contention at the input. This condition can only occur when P0=1 and G0=0, since all the other terms in the equation are the same. The results of the above condition makes C3a=0 and C3b=1 (G3, G2 and G1 terms are equal to 0).

When these logical values are applied to the traditional multiplexor implementation shown in FIG. 5, the select signal Cin is required only in series with the P channel device 40 connected to C3a and the N channel device 48 connected to C3b to remove any possibility of output contention. All other conditions will produce no output contention (C3a=C3b) and, hence, require no other select signal structure.

Using the above derived technique of exploiting the non-exclusiveness of the carry generate and carryout propagate terms, a circuit may be designed which reduces the carryin to carryout gate delay from two gate delays to one gate delay. It is to be noted that the concept of generate (G) and propagate (P) signals are well-known in the prior art and a number of various prior art circuits are known to provide the G and P signals. One reference in the earlier mentioned U.S. Pat. No. 4,737,926, which is incorporated herein by reference.

Referring to FIG. 6, a circuit 50 is constructed in accordance with the determination of the results derived by the above boolean equations. Circuit 50 is comprised of two CMOS drivers 51 and 52 only. An inverter, which was present in the prior art circuit 38, is not needed with the circuit 50 of the present invention. Driver 51 is comprised of two p-type transistors 53 and 54 and a n-type transistor 55 coupled between a supply source VCC and its return, which in this case is ground. Driver 52 is comprised of a p-type transistor 56 and two n-type transistors 57 and 58 coupled between VCC and ground. The sources of transistors 53 and 56 are coupled to VCC, while the sources of transistors 55 and 58 are coupled to ground. The drains of transistors 54 and 55 are coupled to an output node 59, as well as the drains of transistors 56 and 57. The drain of transistor 53 is coupled to the source of transistor 54, while the drain of transistor 58 is coupled to the source of transistor 57. The $Cout_0$ input is coupled to the gates of transistors 53 and 55. The $Cout_1$ input is coupled to the gates of transistors 56 and 58. The carryin select signal Cin is coupled to the gates of transistors 54 and 57. It will also be noted that output node 59 provides an output Cout/, which is equivalent to the Cout/ signal of circuit 38 of FIG. 5.

It is to be appreciated that the coupling to transistors 53–54 and 56–57 can be readily reversed (that is, Cin can be coupled to transistors 53 and 58, $Cout_0$ to transistors 54 and 55, and $Cout_1$ input to 56 and 57) to practice the present invention.

Because the multiplexer circuit 50 of the present invention operates in accordance with the carry generation of Equation 11, it provides the equivalent boolean result as circuit 38, except that one gate delay has been eliminated. That is, taking any input to output path, only one device is encountered. Thus, only one gate delay results. If, assuming that each of the two gate delays of circuit 38 of FIG. 5 are equal, then a 50% reduction in the delay time has been achieved. In any event, the inverter 36 gate delay has been removed.

Thus a carry select multiplexer having an improved result in the delay time is described.

I claim:

1. In a digital processor having a plurality of adder stages, each for adding corresponding bits of at least two numbers which are to be added along with a carryin to generate a sum and a carryout from each stage, wherein a carryout from each stage is coupled as a carryin to a subsequent stage, each said adder stage having two adders, first of said adders for receiving said corresponding bits of said numbers and generating a sum and a carryout assuming a carryin having a value of zero, and second of said adders for receiving said corresponding bits of said numbers and generating a sum and a carryout assuming a carryin having a value of one, a carry select apparatus for selecting one of said adder outputs for each stage, except when said adder carryouts are equal, comprising:

selecting means for each said stage for selecting between said adder carryouts, except when said adder carryouts are equal, each said selecting means comprising:

a first driver coupled to receive said carryout from said first adder, said first driver having a certain delay;

a second driver coupled to receive said carryout from said second adder, said second driver also having said certain delay;

said carryin from a preceding stage being coupled simultaneously to said first and second drivers for controlling said drivers for selecting between said two carryouts, except when said carryouts are equal, to determine a carryout from said stage, said first and second drivers operating in parallel such that each of said selecting means has a delay equivalent to said certain delay.

2. The carry select apparatus of claim 1, wherein said first and second drivers are complementary metal-oxide-semiconductor (CMOS) drivers.

3. In a digital processor having a plurality of adder stages, each for adding corresponding bits of at least two numbers which are to be added along with a carryin to generate a sum and a carryout from each stage, wherein a carryout from each stage is coupled as a carryin to a subsequent stage, each said adder stage having two adders, first of said adders for receiving said corresponding bits of said numbers and generating a sum and a carryout assuming a carryin having a value of zero, and second of said adders for receiving said corresponding bits of said numbers and generating a sum and a carryout assuming a carryin having a value of one, for each adder stage a carry select multiplexer for selecting one of said adder outputs for each stage, except when said carryouts from each of said adders are equal, comprising:

a first p-type transistor having its source coupled to a supply voltage;

a second p-type transistor having its source coupled to the drain of said first p-type transistor and its drain coupled to an output node;

a first n-type transistor having its drain coupled to said output node and its source coupled to a return of said supply voltage;

a third p-type transistor having its source coupled to said supply voltage and drain coupled to said output node;

a second n-type transistor having its drain coupled to said output node;

a third n-type transistor having its drain coupled to the source of said second n-type transistor and its source coupled to said return;

said carryout from said first adder being coupled to the gates of said first p-type transistor and said first n-type transistor;
said carryout from said second adder being coupled to the gates of said third p-type transistor and third n-type transistor;
said carryin from a preceding stage being coupled to the gates of said second p-type transistor and said second n-type transistor, wherein a state of said carryin selects between said carryouts, except when said carryouts are equal, and outputs a complement of said selected carryin at said output node, such that said multiplexer has a delay time equivalent to a single transistor delay.

* * * * *